United States Patent
Yamamoto et al.

[11] Patent Number: 6,098,271
[45] Date of Patent: Aug. 8, 2000

[54] METHOD FOR ASSEMBLING A MAGNETIC DISK DRIVE WITH A RELAYING FLEXIBLE PRINTED CIRCUIT SHEET

[75] Inventors: Jinzo Yamamoto; Masahiro Hasumi; Tomoji Sugawa, all of Kawasaki, Japan

[73] Assignee: Fujitsu Limited, Kawasaki, Japan

[21] Appl. No.: 09/262,386

[22] Filed: Mar. 4, 1999

Related U.S. Application Data

[62] Division of application No. 08/863,411, May 27, 1997, which is a continuation of application No. 08/498,855, Jul. 6, 1995, abandoned.

[30] Foreign Application Priority Data

Oct. 4, 1994 [JP] Japan .................................. 6-240007

[51] Int. Cl.[7] ...................................................... G11B 5/42
[52] U.S. Cl. ...................................... 29/603.06; 360/97.01
[58] Field of Search ........................... 29/603.03, 603.04, 29/603.05, 603.06; 360/97.01, 98.01

[56] References Cited

U.S. PATENT DOCUMENTS

| | | | |
|---|---|---|---|
| 4,819,094 | 4/1989 | Oberg | 360/104 |
| 4,996,623 | 2/1991 | Erpelding et al. | 360/104 |
| 5,103,359 | 4/1992 | Marazzo | 360/104 |
| 5,119,168 | 6/1992 | Misawa | 357/68 |
| 5,126,903 | 6/1992 | Matsuzaki | 360/104 |
| 5,150,193 | 9/1992 | Yasuhara et al. | 357/70 |
| 5,343,344 | 8/1994 | Nagase | 360/104 |
| 5,422,764 | 6/1995 | McIlvanie | 360/97.01 |
| 5,433,822 | 7/1995 | Mimura et al. | 156/659.1 |
| 5,519,552 | 5/1996 | Kohira et al. | 360/104 |
| 5,631,786 | 5/1997 | Erpelding | 360/97.01 |

FOREIGN PATENT DOCUMENTS

| | | |
|---|---|---|
| 63-299133 | 12/1988 | Japan . |
| 2-280961 | 11/1990 | Japan . |
| 4-40680 | 2/1992 | Japan . |
| 4-69803 | 3/1992 | Japan . |

*Primary Examiner*—Carl E. Hall
*Attorney, Agent, or Firm*—Greer, Burns & Crain, Ltd.

[57] ABSTRACT

A method for assembling a magnetic disk drive with a relaying flexible printed circuit sheet and an actuator includes shaping at least one metal bump to form a first terminal on the relaying flexible printed circuit sheet. The shape of the metal bump determines the amount of solder that will adhere to the metal bump. This amount must be adequate to form an efficient electrical and mechanical connection between the first terminal and a second terminal on the actuator. The next step is laying solder on the metal bump so that the adequate amount of solder remains on the metal bump and forms a solder layer. After the solder layer is formed on the metal bump, the first terminal is placed on the second terminal so that the solder is squeezed between the first and second terminals.

5 Claims, 11 Drawing Sheets

METHOD FOR ASSEMBLING A MAGNETIC DISK DRIVE WITH A RELAYING FLEXIBLE PRINTED CIRCUIT SHEET

This is a divisional of application Ser. No. 08/863,411, filed May 27, 1997, which is a continuation of application Ser. No. 08/498,855 filed Jul. 6, 1995, now abandoned.

BACKGROUND OF THE INVENTION

1. Field of the Invention

This invention relates generally to a magnetic disk drive, and more particularly to an electrical connection technique for supplying a write signal to a magnetic head or recalling a signal, which has been read by the magnetic head, from the magnetic disk drive.

2. Description of the Related Art

Recently, the trend is to reduce the size and thickness of magnetic disk drives. Also, realization of magnetic disk drives, which consume only a small amount of electric power is required. Further, improvement of recording density of a magnetic disk is demanded in order to fulfill the requirement for the magnetic disk drive of having a larger capacity, and therefore, the number of magnetic disks to be loaded on the magnetic disk drive is increased.

A magnetic disk drive for computers generally employs a contact start and stop (CSS) system for regulating a relation between a head and a magnetic disk. According to this system, the head is raised slightly upwardly from the magnetic disk during the rotation of the magnetic disk, keeping only a very small space between the head and the magnetic disk. The head is raised because of a balance of force between a floating force produced by an air flow caused by high-speed rotation of the magnetic disk and a force of a spring arm. When the magnetic disk stops rotating, the head moves to a contact allowable area on the disk where the head contacts the disk. During the time the magnetic disk stops rotation, the head is kept in contact with the magnetic disk.

Heretofore, in order to supply write signals to a magnetic head or in order to recall signals, which have been read by the magnetic disk, outside from the magnetic disk drive, lead wires attached to a spring arm (suspension) are used. However, as the magnetic disk drive is gradually downsized, the construction of the spring arm is changed from the type in which the spring arm has lead wires attached thereto, to the type in which the spring arm has a conductor pattern connected to the magnetic head and integral with the surface of the spring arm.

In the conventional disk drive in which the spring arm having a conductor pattern is employed, a main flexible printed circuit sheet (hereinafter referred to as the "main FPC") is disposed within the disk drive. The main flexible printed circuit sheet is employed to provide a wiring to an electronic circuit unit which is placed outside the magnetic disk drive. Terminals disposed at a basal end portion of the spring arm and terminals of the main FPC are connected to each other by way of lead wires. Since a distal end portion of the main FPC is secured to an actuator arm by adhesive or screw means, the lead wires are laid along the side surface of the actuator arm.

A magneto-resistive head (MR head) or compound head is recently developed as a head of a magnetic disk drive. This MR head is designed such that an inductive element is used when data is written and an magnetoresistive element (MR element) is used when data is read. Consequently, signal wires (or signal conductors) are increased in number from two, as had by the typical conventional head, to four. Therefore, if the terminals of the spring arm and the terminals of the main FPC are connected to each other by way of lead wires as in the prior art, the number of the steps for wiring and assembling are increased by double. Further, since the number of the terminals is increased, the space for installing the terminals of the spring arm and main FPC is also required twice as large as ever. However, since the recent magnetic disk drive is gradually made smaller and smaller and thinner and thinner, it becomes increasingly difficult to obtain a sufficient space for the terminals portion. As a consequence, the terminals portion becomes smaller and a space between adjacent terminals is unavoidably decreased.

Because of the reasons set forth herein before, it is not desirable to use lead wires for interconnecting the terminals of the spring arm and main FPC, but it is desirable to interconnect the terminals of the spring arm and main FPC by way of a relaying flexible printed circuit sheet (hereinafter referred to as the "relaying FPC"). In case the terminals are interconnected by the relaying PFC, a technique for simultaneously connecting a plurality of terminals by soldering, gold contact adhesion, or the like is required. Since there is a possibility of the need of some repairing such as replacement of the head due to mismatch of characteristics between the magnetic disk and the head when the magnetic disk drive is assembled, soldering is advantageous for interconnecting the terminals because repeated connection can be made by soldering.

However, since the terminals portion becomes smaller and the space between the terminals becomes narrower as the downsizing of the magnetic disk drive is further progressed, a required quantity of solder becomes smaller. Therefore, it can be easily imagined that the normal solder connecting technique is not enough to cope with the short-circuit troubles between the terminals and cannot provide a sufficient strength of connection between the terminals. Further, since old solder used before the repairing operation is partly remained on the terminal or terminals when the head is replaced/repaired, stability of the quality of connection becomes more difficult to obtain.

SUMMARY OF THE INVENTION

It is, therefore, an object of the present invention to provide a magnetic disk drive having an electrical connection structure capable of supplying /recalling a reliable magnetic head signal.

Another object of the present invention is to provide a magnetic disk drive having an electrical connection structure capable of head replacement or repair.

A further object of the invention is to provide a method for assembling a magnetic disk drive capable of reducing the assembling cost by enabling to connect a plurality of terminals as one group.

In accordance with an aspect of the present invention, there is provided a magnetic disk drive including a base and a magnetic head for writing/reading data with respect to a magnetic disk, comprising, an actuator arm rotatably mounted on the base; a spring arm whose basal end portion is secured to a distal end portion of the actuator arm, the spring arm supporting the magnetic head on the distal end portion thereof, and having a first conductor pattern one end of which is connected to the magnetic head, and having first terminals connected to the other end of the first conductor pattern; a main flexible printed circuit sheet whose one end portion is secured to the actuator arm, the main flexible printed circuit sheet having a second conductor pattern for extracting a signal, and having second terminals connected to one end of the second conductor pattern; and a relaying flexible printed circuit sheet attached to the actuator arm, the relaying flexible printed circuit sheet having a third conductor pattern having third and fourth terminals connected respectively to opposite ends of the third conductor pattern, the third and fourth terminals each including a convex metal bump and having a solder formed on an outer surface of the convex metal bump, the third and fourth terminals being connected respectively to the first and second terminals by soldering.

In accordance with another aspect of the present invention, there is provided a method of mounting a relaying flexible printed circuit sheet of a magnetic disk drive, the magnetic disk drive including a plurality of actuator arms rotatably mounted on a base; a plurality of spring arms whose basal end portions are secured respectively to distal end portions of the actuator arms, the spring arms each supporting a magnetic head on the distal end portion thereof, and having first conductor pattern one end of which is connected to the magnetic head and first terminals which are connected to the other end of the first conductor pattern; and a main flexible printed circuit sheet whose one end portion is secured to the actuator arm, the main flexible printed circuit sheet having a second conductor pattern and second terminals connected to one end of the second conductor pattern; the mounting method comprising the steps of: preparing a plurality of relaying flexible printed circuit sheets each having a third conductor pattern and third and fourth terminals connected respectively to opposite ends of the third conductor pattern; preparing an aligning sheet having a plurality of positioning reference holes; attaching in alignment the plurality of relaying flexible printed circuit sheets onto the aligning sheet with a predetermined space from each other; placing the plurality of actuator arms on an assembling table having a plurality of positioning pins corresponding to the reference holes with the predetermined space from each other; bonding the plurality of relaying flexible printed circuit sheets respectively to the plurality of actuator arms while fitting the reference holes of the aligning sheet to the positioning pins; and soldering the third and fourth terminals respectively to the first and second terminals.

Since each terminal of the relaying flexible printed circuit sheet is formed of a convex metal, the terminal can be improved in solder holding ability. Consequently, a sufficient supply of solder for connection can be realized. As a consequence, the quality of connection can be stabilized. Further, if replacement of the head assembly becomes necessary, it is enough to exchange only the required head assembly and relaying flexible printed circuit sheet. Therefore, it becomes possible to repair only the required parts, leaving the non-required and thus good head assembly intact.

Furthermore, the conditions for assembly realizing the stability of the quality of connection become not very severe, a plurality of terminals can be connected at the same time, and therefore the assembling cost can be reduced. Although the relaying flexible printed circuit sheet is separately provided for each actuator arm in order to facilitate the head replacement/repair, they can be handled as if they were a single sheet by attaching them in alignment onto an aligning sheet when the magnetic disk drive is assembled. As a consequence, the assembling cost of the relaying flexible printed circuit sheets set can be reduced.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENT

Figure 1:
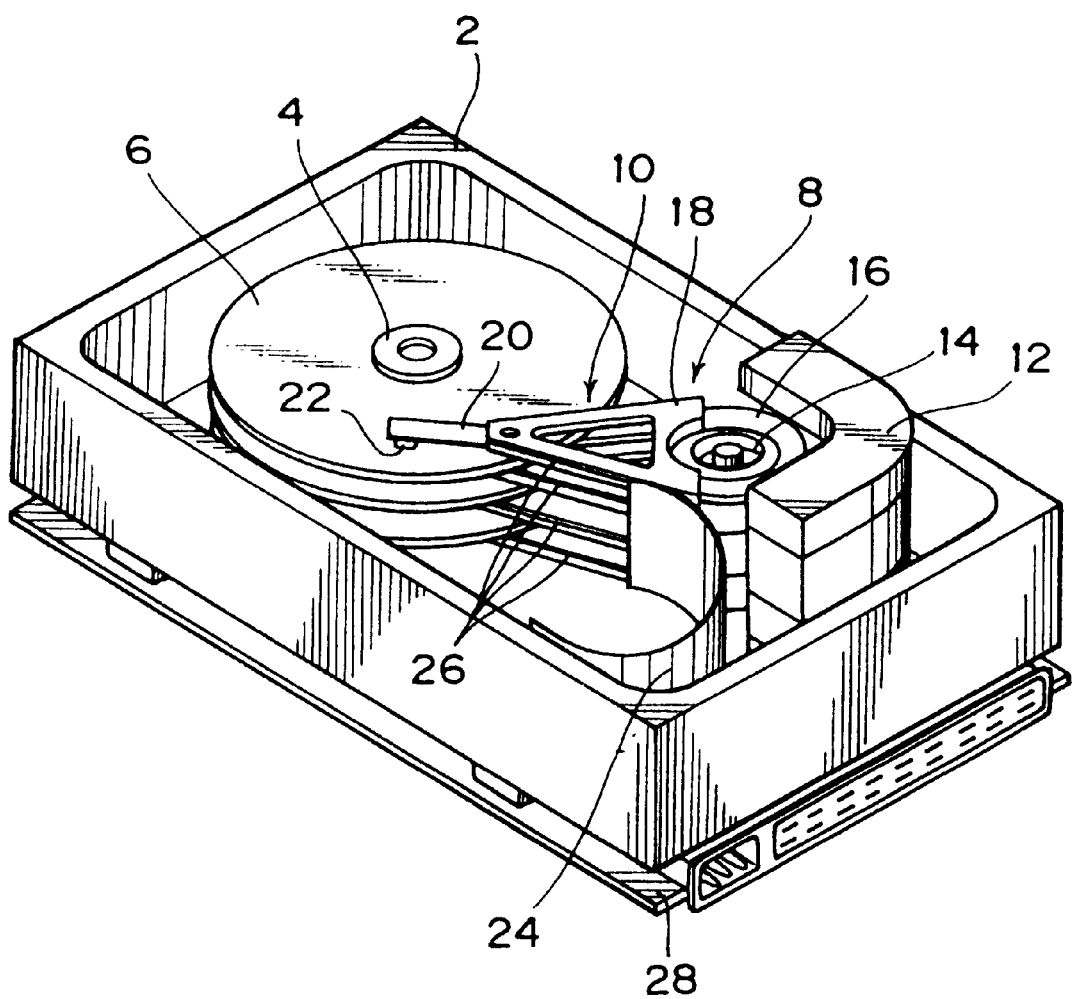
FIG. 1 is a perspective view of a magnetic disk drive from which a cover has been removed.

Referring to FIG. 1, there is shown a perspective view showing a magnetic disk drive of the present invention, from which a cover has been removed. Reference numeral 2 denotes a base which cooperates with a cover, not shown, to constitute a housing. A spindle 4, which is rotationally driven by an inner hub motor, not shown, is disposed on the base 2. Magnetic disks 6 and spacers, not shown, are alternately inserted in the spindle 4. In this way, a plurality of magnetic disks 6 are mounted on the spindle 4 with a predetermined space. Reference numeral 8 denotes a rotary head actuator which is constituted of an actuator arm assembly 10 and a magnetic circuit 12.

Figure 2:
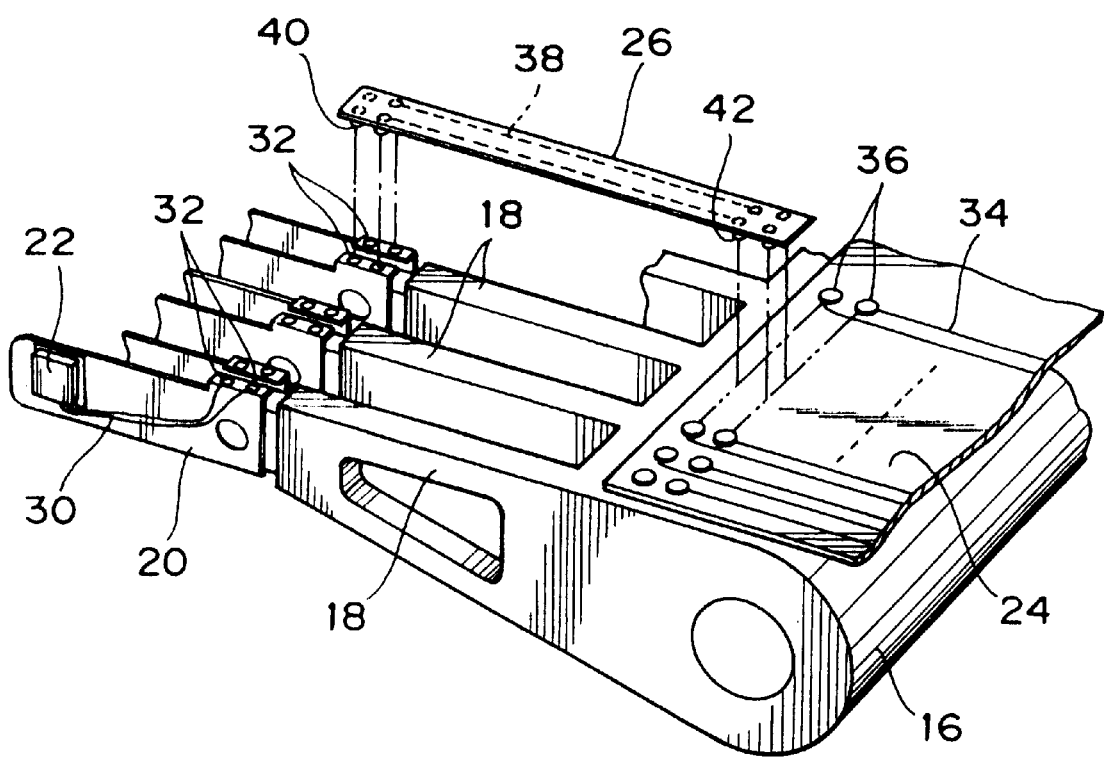
FIG. 2 is a perspective view of a first embodiment of the present invention.

The actuator arm assembly 10 includes an actuator block 16 rotatably mounted through a bearing on a shaft 14 which is secured to the base 2. A plurality of actuator arms 18 are integrally formed with the actuator block 16. A basal portions of spring arms (suspensions) 20, which support on distal end portions thereof magnetic heads 22, respectively, are secured to distal ends of the actuator arms 18, respectively. As shown in FIG. 2, each spring arm 20 has a conductor pattern 30 one end of which is connected to the magnetic head 22.

Reference numeral 24 denotes a main flexible printed circuit sheet (hereinafter referred to as the "main FPC"). One end portion of the main FPC 24 is fixedly bonded or screwed to a side face of the actuator block 16. Relaying flexible printed circuit sheets (hereinafter referred to as the "relaying or relay FPC") 26 for connecting the conductor patterns 30 of the spring arms 20 and the conductor patterns 34 of the main FPC 24 are attached respectively to side faces of the actuator arms 18.

Referring to FIG. 2, there is illustrated a perspective view of the first embodiment of the present invention. A state of connection of each conductor pattern will be described in detail with reference to FIG. 2. The spring arm 20 is provided on a base end portion thereof with terminals 32 which are connected to the conductor pattern 30. The main FPC 24 has terminals 36 which are connected to the conductor pattern 34. The relay FPC 26 has a conductor pattern 38, and terminals 40, 42 which are connected to opposite ends of the conductor pattern 38. A gold plating or very thin (about several μm) solder plating is applied to the terminals 32 of the spring arm 20 and to the terminals 36 of the main FPC 24.

Figure 3:
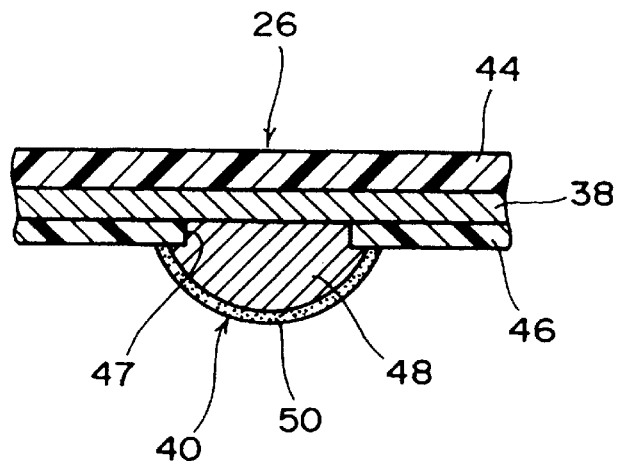
FIG. 3 is a sectional view showing a structure of a terminal of a relaying FPC.

FIG. 3 shows a section of the terminal portion of the relay FPC 26. The relay FPC 26 is constituted by sandwiching the conductor pattern 38 with polyimide films 44, 46. A resist material may be employed instead of the polyimide film 46. The terminal 40 is provided with an opening 47. The opening 47 is formed in the polyimide film 46 covering the conductor pattern 38. The terminal 40 is constituted of a copper bump 48 formed at this opening portion by copper plating, and a solder 50 which is applied onto the copper bump 48. The solder 50 is applied onto the copper bump 48 by solder plating or solder dipping. It is necessary to preliminarily reduce the diameter of the opening 47, which is formed in the polyimide film 46, in order to match with the final bump diameter because the copper bump 48 also spreads laterally from the surface of the polyimide film 46.

It is preferred that the terminal 40 is made into a semi-spherical configuration as much as possible, in order to improve the quality of connection. The terminal 42 is also constituted in the same manner as in the case with the terminal 40. Instead of the copper bump 48, a bump made of nickel can also be employed. That is, the material forming the bump is not particularly limited as long as the material has electrical conductivity and solder connectability, and as long as the material has a melting temperature higher than the melting temperature of solder. By soldering the terminals 40, 42 of the relay FPC 26 respectively to the terminals 32 of the spring arms 20 and the terminals 36 of the main FPC 24, the conductor patterns 30 of the spring arms 20 and the conductor pattern 35 of the main FPC 24 are connected to each other through the conductor patterns 38 of the relaying FPC 26.

Figure 4:
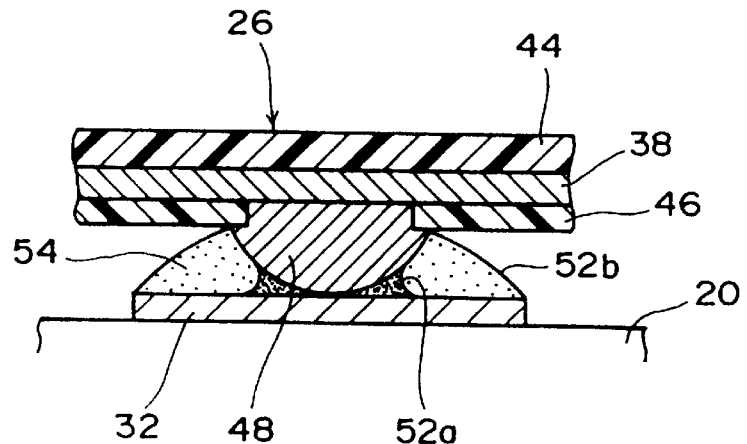
FIG. 4 is a sectional view showing a state of connection achieved by the use of soldering.

Referring to FIG. 4, there is illustrated a state of connection between terminals achieved by the use of solder. A solder fillet 52a or 52b is formed on an outer peripheral portion of the copper bump 48. With this feature, the solder holding ability of the terminal portion is improved. Owing to a provision of the copper bump 48, formation of a short-circuit between the terminals can be prevented, the necessary and sufficient supply of solder can be achieved, and the remaining portion of the solder at the time the head is replaced/repaired can also be absorbed. In FIG. 4, reference numeral 52a denotes a solder fillet when the quantity of solder is smallest, and reference numeral 52b denotes a solder fillet when the quantity of solder is largest. An area 54 between the smallest solder fillet 52a and the largest solder fillet 52b is in a range where the quantity of solder can be adjusted.

Figure 5:
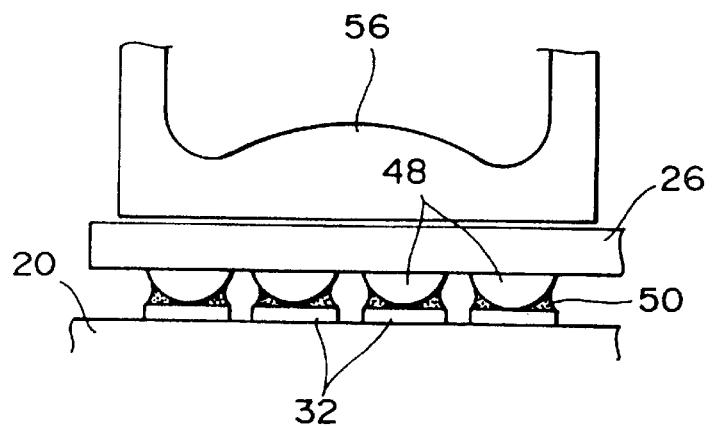
FIG. 5 is a schematic view for explaining connection of a plurality of terminals as one group.

As shown in FIG. 5, connection between the terminals is achieved by heating from an opposite surface of the copper bumps 48 which are formed on the relaying FPC 26 by the use of a heat chip 56. The solder 50 is melted so that connection between the terminals is performed as one group. This way of connection as one group is also applied to connection between the terminals 42 of the relaying FPC 26 and the terminals 36 of the main FPC 34.

Figure 6A:
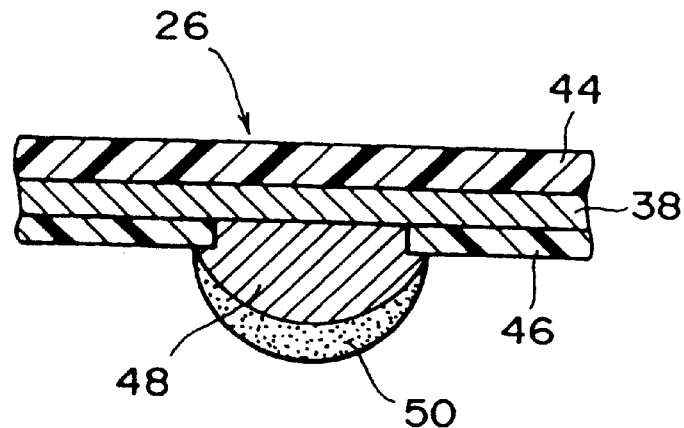
FIGS. 6A to 6C are sectional views showing a variety of terminal structures.
Figure 6B:
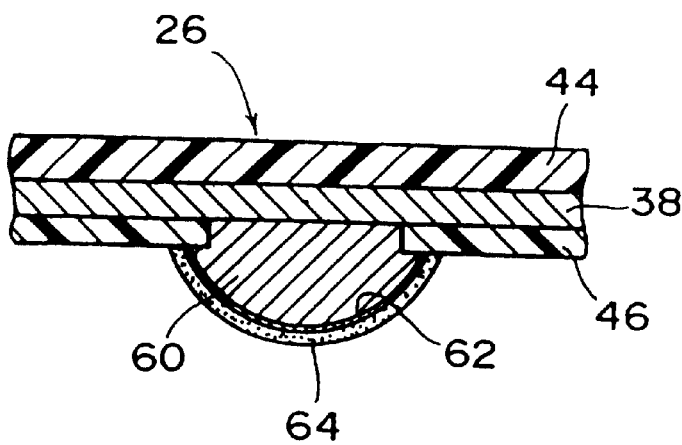
Figure 6C:
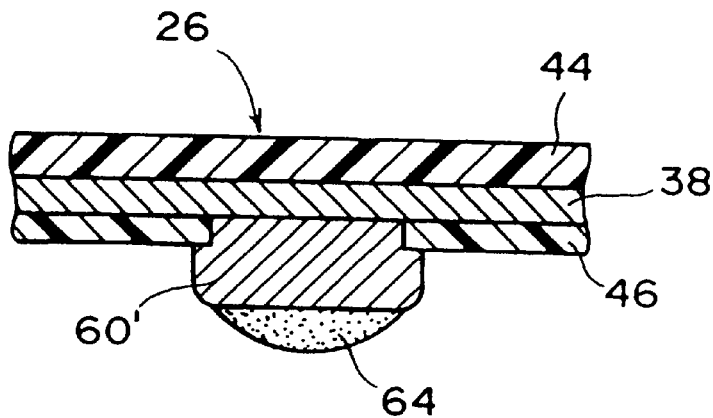

Referring to FIGS. 6A to 6C, various terminal structures of the relaying FPC 26 are shown. In the terminal 40 shown in FIG. 3, the solder 50 is formed on the copper bump 48 by plating. However, a solder plating is unstable in composition and availability of a margin in the direction of the bump height is necessary. Therefore, it is preferred that the solder 50 formed on the copper bump 48 by solder plating is subjected to fusing treatment. This fusing treatment is a treatment for melting the solder by applying a flux to the terminal portion. A terminal structure subjected to fusing treatment is illustrated in FIG. 6A.

A terminal structure shown in FIG. 6B includes a nickel bump 60 which is formed by plating. With respect to nickel, a gold layer is usually employed as an intermediate member in order to make a connection by the use of solder. For this purpose, a gold layer 62 is applied onto the nickel bump 60 by plating, deposition, or the like. In the terminal structure shown in FIG. 6B, if the solder is melted by the heat chip 56 from the opposite side of the terminal portion of the relaying FPC 26 as shown in FIG. 5, there is a fear that the quality of connection achieved by the use of solder is adversely affected because the gold layer 62 is scattered in the solder 64. Therefore, it is preferred that the solder dipping is performed after the gold layer 62 is formed and that the solder 64 and the nickel bump 60 are connected while removing the gold layer. In this case, it is preferred that the nickel bump is formed into a cylindrical configuration 60' as shown in FIG. 6C, in order to hold the quantity of solder.

Figure 7A:
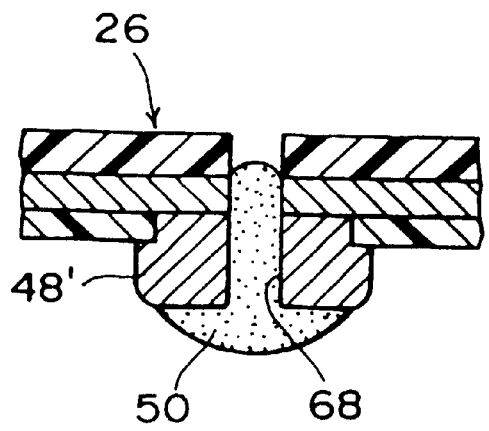
FIGS. 7A to 7D are sectional views showing other terminal structures.
Figure 7C:
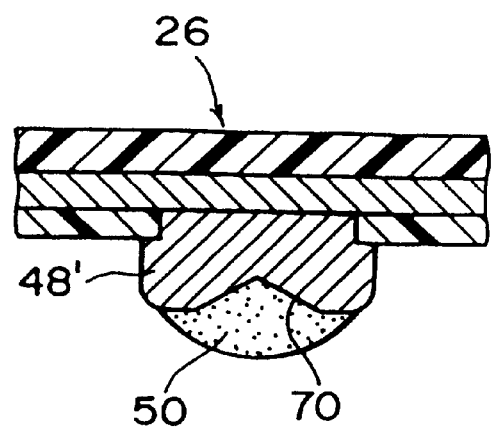
Figure 7B:
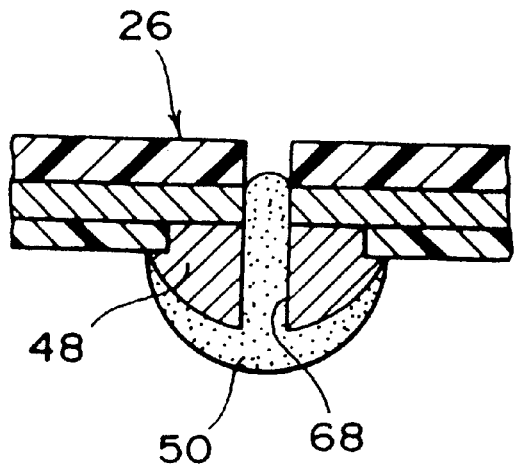
Figure 7D:
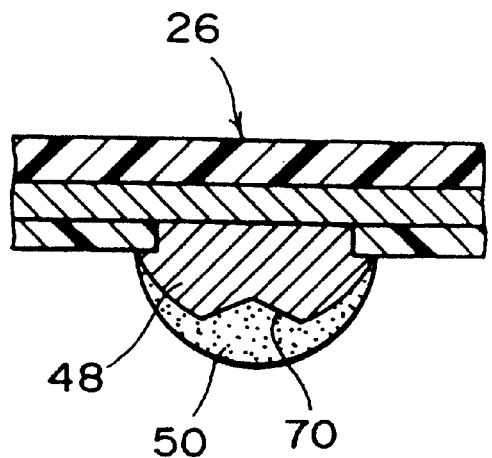

FIGS. 7A to 7D show other terminal structures. FIGS. 7A and 7B show through-hole type terminal structures, while FIGS. 7C and 7D show recess type terminal structures. As shown in FIGS. 7A and 7B, a hole 68 is formed in a cylindrical copper bump 48' or a semispherical copper bumper 48, and a solder 50 is applied by solder dipping. In the alternative, as shown in FIGS. 7C and 7D, a recess 70 is formed in the cylindrical copper bump 48' or the semi-spherical copper bump 48, and the solder 50 is applied by solder dipping. When the solder dipping is performed, the quantity of solder becomes difficult to be accurately controlled because the quantity of solder to be applied depends on the bump configuration. For this reason, it is preferred that the terminal structures as shown in FIGS. 7A to 7D are employed in order to hold the necessary quantity of solder.

As shown in FIG. 2, the relaying FPC 26 is separately provided for each actuator arm. Owing to this arrangement, when the head assembly is replaced/repaired, the replacement can be made per arm unit. More specifically, for repairing, the relaying FPC 26 is peeled off and connection is performed again using a new relaying FPC after the head assembly has been replaced. Consequently, the old solder used before the repairing operation is partly remained at the spring arm terminal portions and main FPC terminal portions which have not been replaced. However, since the terminals 40, 42 of the relaying FPC 26 have the copper bump 48, the solder holding ability is high and therefore, no serious problem may occur.

Figure 8:
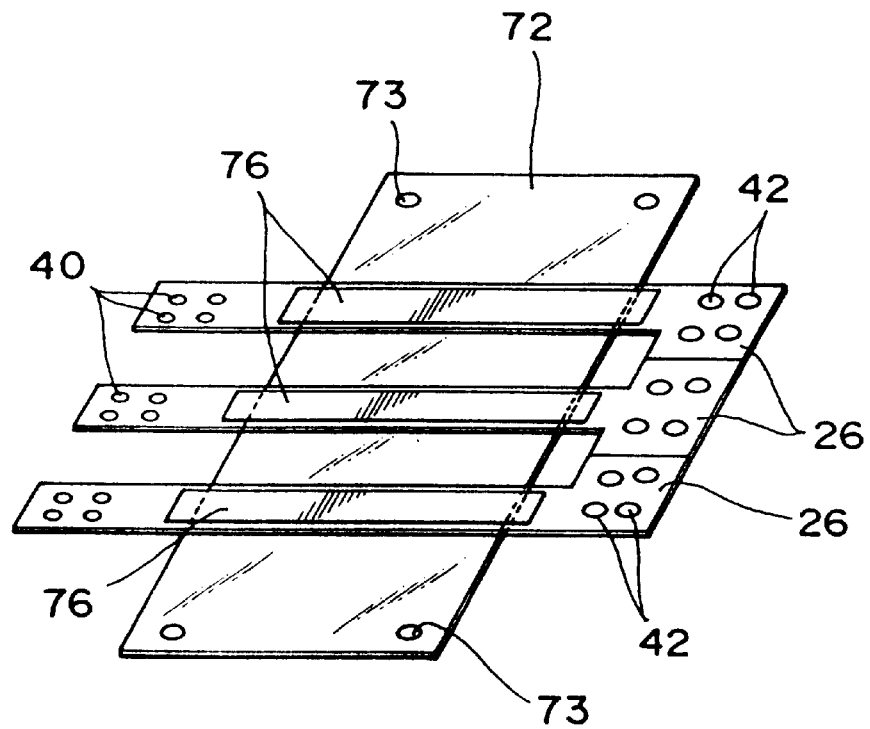
FIG. 8 is a perspective view showing a method of aligning the relaying FPCs.
Figure 9:
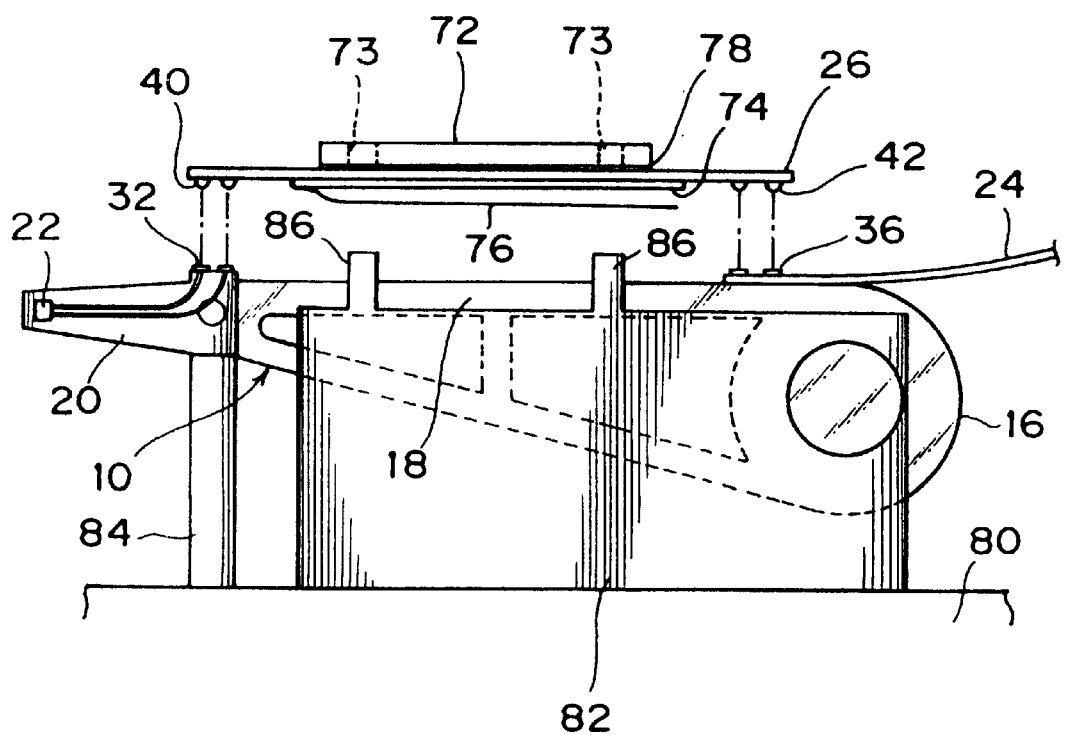
FIG. 9 is a schematic front view for explaining the relaying FPCs as one group.

Next, referring to FIGS. 8 and 9, a method of mounting a relaying FPC, which is improved in assembling workability, will be described. As shown in FIG. 8, the relaying FPCs 26 are attached in alignment onto an aligning sheet 72 having a rigidity by weak adhesive 78 (see FIG. 9). The aligning sheet 72 has reference holes 73 for positioning. The reference holes 73 are formed in corner portions of the aligning sheet 72. As shown in FIG. 9, a pressure sensitive adhesive double coated tape 74 is attached to the surface of the relaying FPC 26 located on the opposite side of the aligning sheet 72, and a protective sheet 76 is attached to the top of the double coated tape 74. Reference numeral 80 denotes an assembling table which has support members 82, 84. A pair of the support members 82 are formed on opposite ends of the assembling table 80. A pair of positioning pins 86 are provided on an upper end portion of each support member 82.

First, the actuator arm assembly 10 is placed on the support members 82, 84 of the assembling table 80. Then, after the protective sheet 76 are peeled off, the relaying FPCs 26 are attached to the side faces of the actuator arms 18 while positioning the reference holes 73 of the aligning sheet 72 by the positioning pins 86. By doing this, the terminals 40, 42 of the relaying FPC are brought into alignment with the terminals 32 of the spring arms 20, respectively and the terminals 36 of the main FPC 24 and the relaying FPCs are bonded to the side surfaces of the actuator arms 18.

Thereafter, the aligning sheet 72 is peeled off the relaying FPCs 26. At that time, the weak adhesive 78 is attached to the aligning sheet 72 side. By aligning the plurality of relaying FPCs 26 on the aligning sheet in this way when the magnetic disk drive is assembled, they can be handled as if they were a single FPC. As a consequence, the assembling cost of the relaying FPCs 26 can be reduced.

Figure 10:
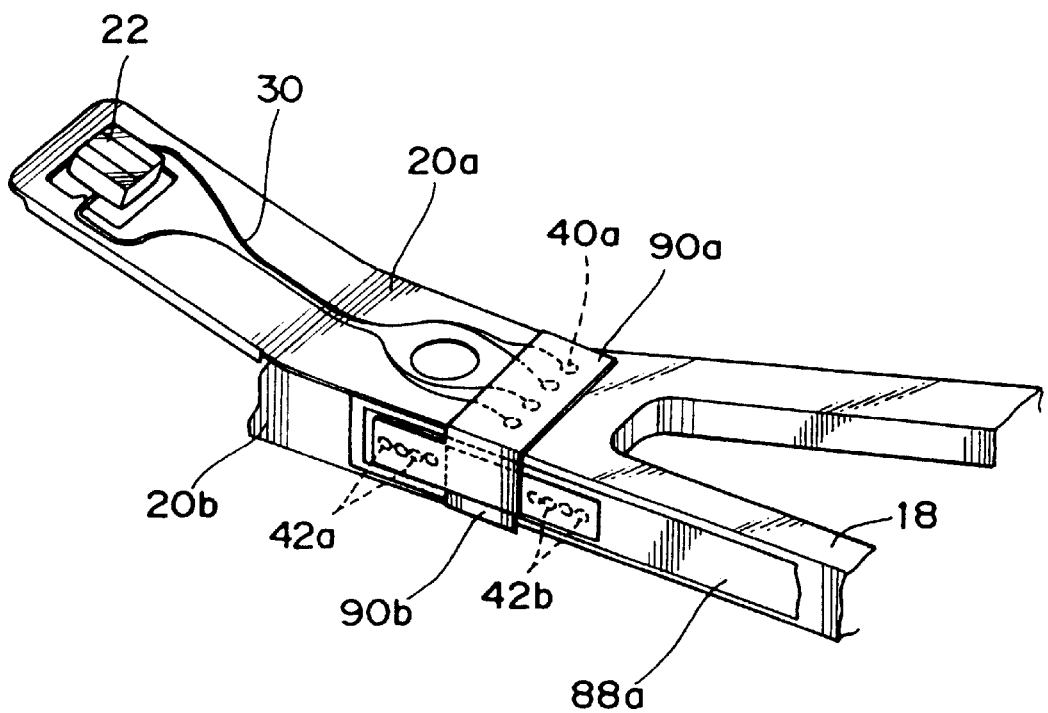
FIG. 10 is a perspective view of a second embodiment of the present invention.
Figure 11:
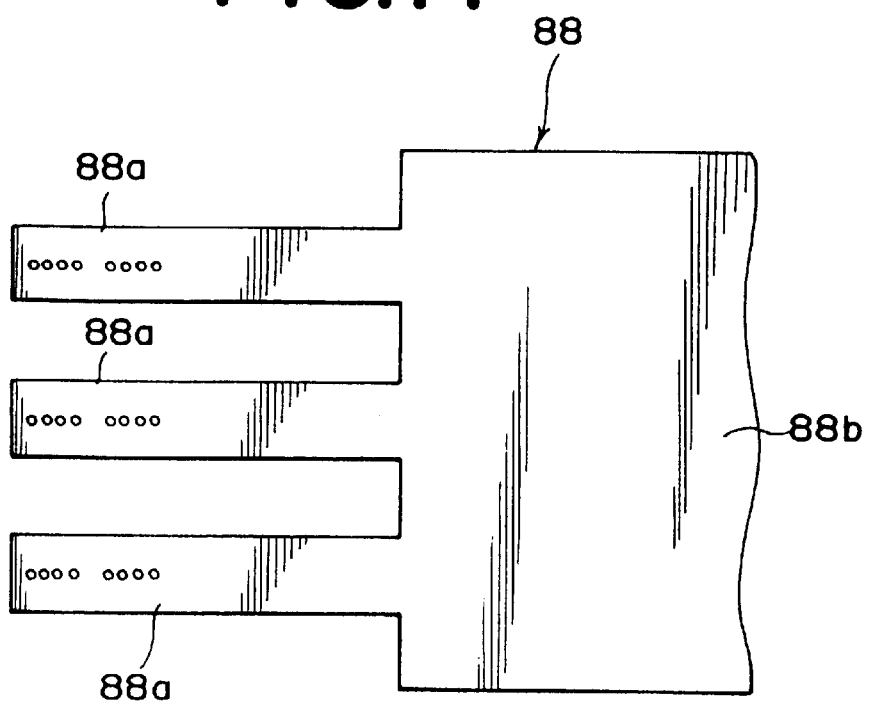
FIG. 11 is a plan view, partly cut-away, of a comb-teeth like main FPC.

Referring to FIG. 10, there is illustrated a perspective view of a second embodiment of the present invention. In this embodiment, as shown in FIG. 11, a comb-teeth like main FPC 88 is used, in which a plurality of extended portions 88a are connected by a base portion 88b. As shown in FIG. 10, the extended portion 88a of the comb-teeth like main FPC 88 is attached to a side face of the actuator arm 18. The upper spring arm 20a and the lower spring arm 20b are secured to a distal end portion of the actuator arm 18.

Figure 12:
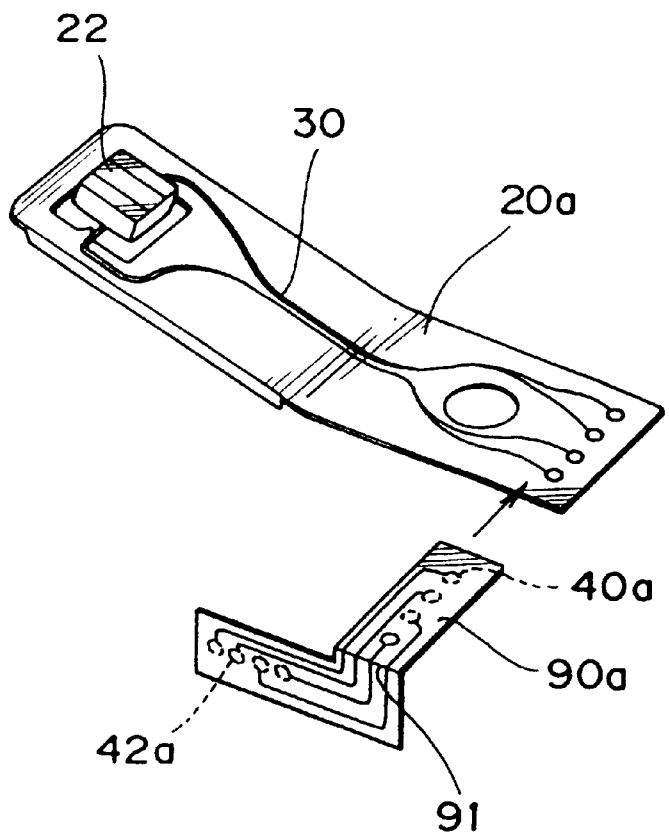
FIG. 12 is an exploded perspective view for mounting the relaying FPC on a spring arm.

By aligning terminals 40a, 42a of an upper spring arm relaying FPC 90a to the terminals of the. upper spring arm 20a and the terminals of the comb-teeth like main FPC 88, respectively, the FPC 90a is bonded to the distal end portion of the actuator arm 18. Likewise, by aligning terminals 40b (not shown), 42b of a lower sprign arm relaying FPC 90b to the terminals of the lower spring arm 20b and the comb-teeth like main FPC 88, respectively, the FPC 90b is bonded to the distal end portion of the actuator arm 18. Then, the various terminal portions are connected together at once by the use of the heat chip 56 shown in FIG. 5. As shown in FIG. 12, the upper spring arm relaying FPC 90a is folded by approximately 90 degrees along a line 91. The same is true of the lower spring arm relaying FPC 90b.

Figure 13:
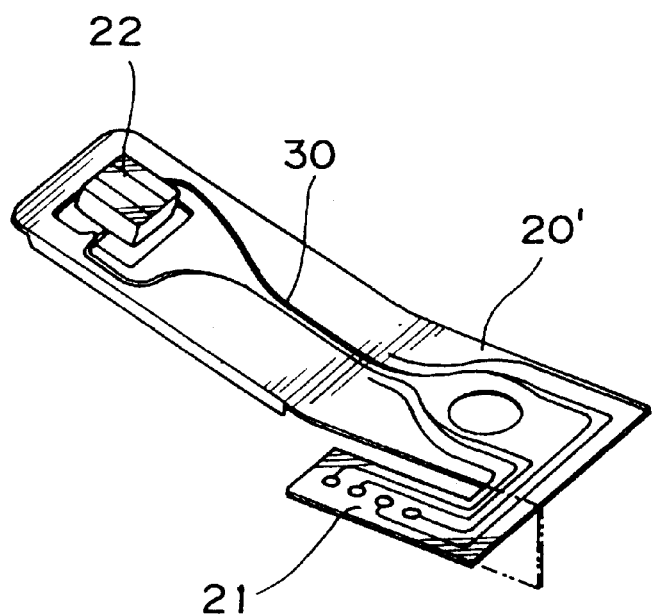
FIG. 13 is a perspective view showing another embodiment of the spring arm.

As shown in FIG. 13, a lead-out portion 21 for leading out the conductor pattern 30 is integrally formed with the spring arm 20'. Owing to this arrangement, the relaying FPC can be eliminated and the comb-teeth like main FPC 88 can be connected directly to the conductor pattern 30 of the spring arm 20'. In this case, a metal bump made of copper or nickel is formed on either the terminal portion of the spring arm 20' or the terminal portion of the comb-teeth like main FPC 88.

Figure 14:
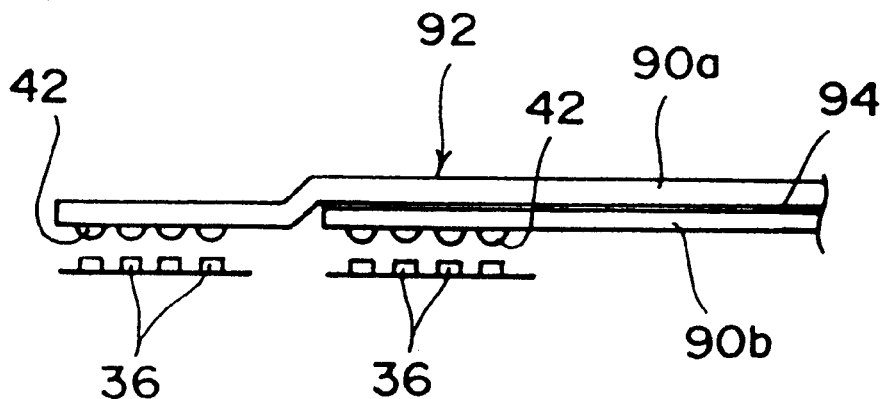
FIG. 14 is a representation showing a bonded relaying FPC obtained by bonding two relaying FPC together.
Figure 15:
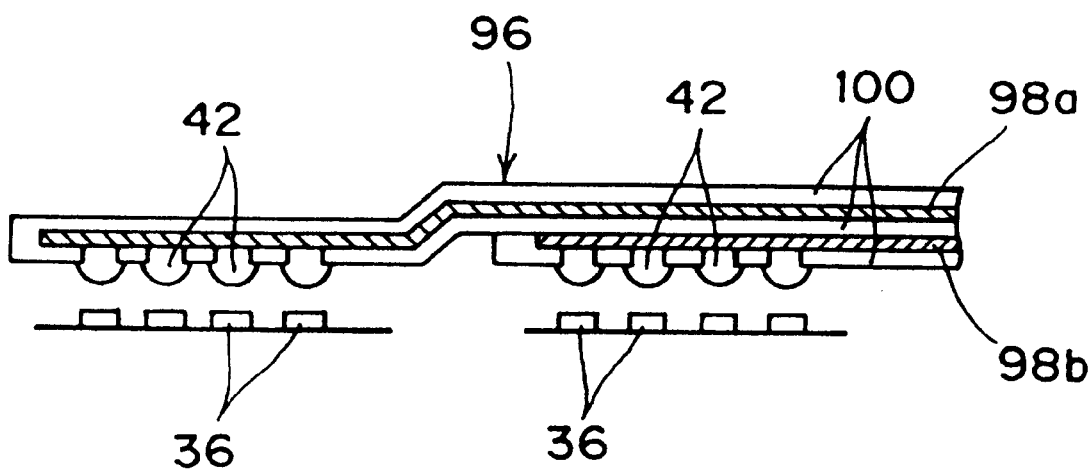
FIG. 15 is a sectional view showing a multilayer relaying FPC.

As the magnetic disk drive is made thinner, the actuator arm is made thinner and too. As a result, it becomes difficult to obtain a sufficient space for forming a conductor pattern of the relaying FPC. To cope with this, there can be contemplated to employ a bonded relaying FPC 92 obtained by bonding the upper relaying FPC 90a and the lower relaying FPC 90b together by a pressure sensitive adhesive double coated tape 94 as shown in FIG. 14. Alternatively, as shown in FIG. 15, it is preferred to employ a muitilayer relaying FPC 96 in which copper patterns 98a, 98b and polyimides 100 are alternately laminated. By employing the bonded relaying FPC 92 or multilayer relaying FPC 96, the tendency of the magnetic disk drive being made thinner and thinner can be sufficiently met.

Figure 16A:
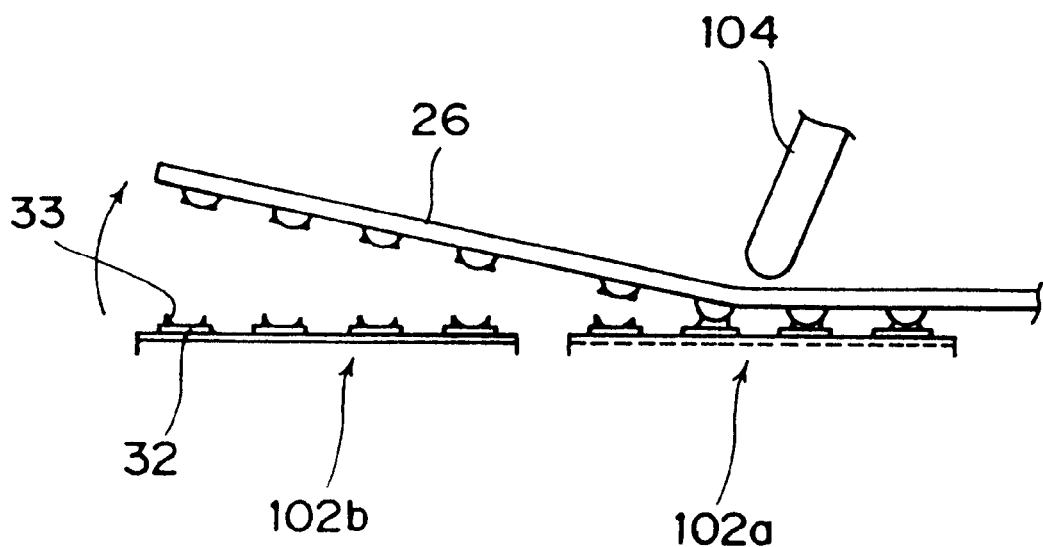
FIGS. 16A to 16B are representations for explaining the replacement/repair of a head assembly.

Next, referring to FIGS. 16A and 16B, replacement/repair of the head assembly will be described. As shown in FIG. 16A, solder of the terminal portion of the repairing part is melted by heating with a soldering bit 104, so that the relaying FPC 26 is peeled off. Reference numeral 102a denotes a good head assembly, whereas reference numeral 102b denotes a poor head assembly which is required to be replaced. A solder residue 33 is produced on each terminal 32 after the relaying FPC 26 has been peeled off.

Figure 16B:
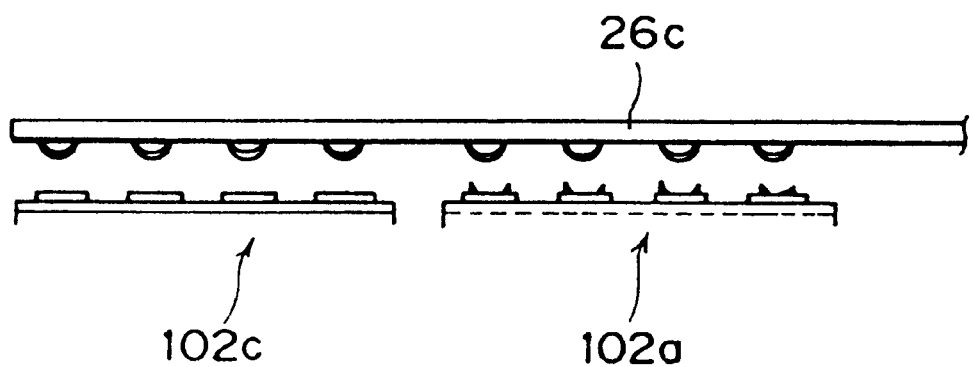
Figure 17:
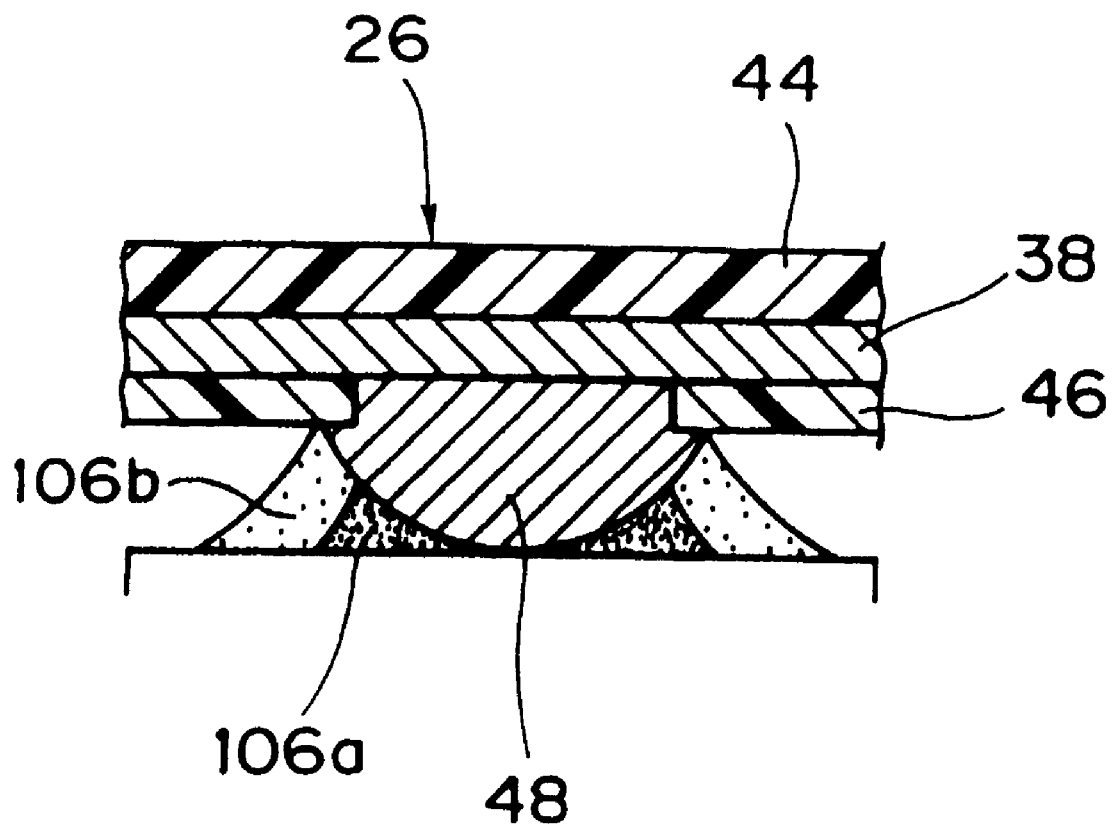
FIG. 17 is a sectional view showing a soldered-state before and after the repair is made.

Next, as shown in FIG. 16B, the poor head assembly 102b is replaced by a new head assembly 102c, and the relaying FPC 26 is replaced by a new relaying FPC 26c. Then, solder of the terminal portion of the new relaying FPC 26c is melted by the soldering bit 104 so that the terminals are connected by way of soldering. Referring to FIG. 17, there is illustrated a state of solder before and after the repairing work is performed. Reference numeral 106a denotes a state of solder before a repairing work is performed, whereas reference numeral 106b denotes a state of solder after a repairing work has been performed. As seen, the quantity of solder is slightly increased after the repairing work has been performed. However, since the solder holding ability of the copper bump 48 is high, no such problem as causing a shortcircuit or the like occurs.

According to the present invention, there is provided a magnetic disk drive having an electrical connection structure which is capable of supplying and recalling a reliable magnetic head signal. Also, in a magnetic disk drive having a small and thin design, even if the terminal portion for the magnetic head signal is made small, connection achieved by the use of solder can be stabilized and the head assembly can also be replaced/repaired. Furthermore, by employing the method of mounting a relaying FPC according to the present invention, a plurality of terminals can be connected as one group and the assembling cost can be reduced.

What is claimed is:

1. A method for assembling a magnetic disk drive with a relaying flexible printed circuit sheet and an actuator, comprising the steps of:

shaping at least one metal bump to form a first terminal on the relaying flexible printed circuit sheet, said shape of said metal bump determining an amount of solder that will adhere to said metal bump said amount being adequate to form an electrical and mechanical connection between said first terminal and a second terminal on the actuator;

laying said solder on said metal bump wherein said amount of said solder remains on said metal bump and forms a solder layer;

after said solder layer is formed on said metal bump, placing said first terminal on said second terminal so that said solder is squeezed between said first and second terminals;

rotatably mounting an actuator arm with a distal end portion on a base of the magnetic disk drive;

placing a first conductor pattern having a first end and a second end on a spring arm with a basal end and a distal end;

connecting a magnetic head to said first end of said first conductor pattern and forming said second terminal on said second end of said first conductor pattern;

securing said basal end portion of said spring arm on said distal end portion of said actuator arm;

forming a second conductor pattern on said relaying flexible printed circuit sheet; and securing said flexible printed circuit sheet to said actuator arm including steps of forming said first terminal on one end of said second conductor pattern laying said solder on said first terminal and placing said first terminal on said second terminal.

2. The method according to claim 1, further comprising the steps of:

forming a third terminal on said relaying flexible printed circuit sheet including the step of shaping a plurality of metal bumps so that an amount of solder adheres to said metal bumps that is adequate to form a mechanical and electrical connection;

placing said third terminal on an end of said second conductor pattern so that said first and third terminals are on opposite ends of said second conductor pattern;

placing a third conductor pattern having a first end with a fourth terminal on a main flexible printed circuit sheet; and securing a first end portion of said main flexible circuit sheet to said actuator arm;

wherein said step of securing the relaying flexible printed circuit to said actuator arm further includes the steps of laying solder on said third terminal and then placing said third terminal on said fourth terminal so that said solder binds said third terminal to said fourth terminal.

3. The method according to claim 2, further comprising the steps of:

preparing a plurality of relaying flexible printed circuit sheets each having said second conductor pattern and said first and third terminals connected respectively to opposite ends of said second conductor pattern;

preparing an aligning sheet having a plurality of positioning reference holes;

attaching said plurality of relaying flexible printed circuit sheets onto said aligning sheet so that adjacent relaying flexible printed circuit sheets are held a predetermined space apart from each other;

forming an assembly table with a plurality of positioning pins with positions corresponding to positions of said reference holes;

placing said plurality of actuator arms on said assembly table so that adjacent actuator arms are held said predetermined space apart from each other;

bonding said plurality of relaying flexible printed circuit sheets respectively to said plurality of actuator arms while fitting said reference holes of said aligning sheet to said positioning pins; and soldering said second and fourth terminals respectively to said first and second terminals.

4. The method according to claim 1, wherein the actuator has a plurality of actuator arms, and further comprising the steps of:

forming said relay flexible printed circuit sheet to be a comb like configuration having a plurality of extended sections and a base portion for interconnecting the extended sections, said extended sections being bonded respectively to said actuator arms; and forming said first terminal on a distal end of each said extended section.

5. The method according to claim 4, further including the step of connecting said base portion to a base of the magnetic disk drive.

* * * * *

UNITED STATES PATENT AND TRADEMARK OFFICE
CERTIFICATE OF CORRECTION

PATENT NO. : 6,098,271
DATED : August 8, 2000
INVENTOR(S) : Yamamoto et al.

It is certified that error appears in the above-indentified patent and that said Letters Patent is hereby corrected as shown below:

Column 9, line 17, delete "pattern laying"

and insert --pattern, laying-- therefor

Signed and Sealed this

Seventeenth Day of April, 2001

Attest:

NICHOLAS P. GODICI

Attesting Officer     Acting Director of the United States Patent and Trademark Office